US006967168B2

(12) United States Patent
Stearns et al.

(10) Patent No.: US 6,967,168 B2
(45) Date of Patent: Nov. 22, 2005

(54) METHOD TO REPAIR LOCALIZED AMPLITUDE DEFECTS IN A EUV LITHOGRAPHY MASK BLANK

(75) Inventors: Daniel G. Stearns, Los Altos, CA (US); Donald W. Sweeney, Livermore, CA (US); Paul B. Mirkarimi, Sunol, CA (US); Henry N. Chapman, Livermore, CA (US)

(73) Assignee: The EUV Limited Liability Corporation, Santa Clara, CA (US)

( * ) Notice: Subject to any disclaimer, the term of this patent is extended or adjusted under 35 U.S.C. 154(b) by 267 days.

(21) Appl. No.: 09/896,722

(22) Filed: Jun. 29, 2001

(65) Prior Publication Data

US 2003/0006214 A1 Jan. 9, 2003

(51) Int. Cl.[7] ................................................ H01L 21/20

(52) U.S. Cl. ....................... 438/706; 438/712; 438/717; 216/66

(58) Field of Search ................................ 438/706, 712, 438/717; 216/66

(56) References Cited

U.S. PATENT DOCUMENTS 5,958,605 A * 9/1999 Montcalm et al. .......... 428/627
6,277,194 B1 * 8/2001 Thilderkvist et al. ......... 117/94

OTHER PUBLICATIONS

Pierrat C. et al: "Multiple–layer blank structure for phase–shifting mask fabrication". Third International Workshop on the Measurement and Characterization of Ultra–Shallow Doping Profiles in Semiconductors, vol. 14, No. 1, pp. 63–68, XP00212708 Journal of Vacuum Science & Technology B (Microelectronics and Nanometer Structures), Jan.–Feb. 1996, AIP for American Vacuum Soc, USA ISSN: 0734–211X the whole document.

* cited by examiner

*Primary Examiner*—Robert Kunemund
(74) *Attorney, Agent, or Firm*—John P. Woolridge; Alan H. Thompson

(57) ABSTRACT

A method and apparatus are provided for the repair of an amplitude defect in a multilayer coating. A significant number of layers underneath the amplitude defect are undamaged. The repair technique restores the local reflectivity of the coating by physically removing the defect and leaving a wide, shallow crater that exposes the underlying intact layers. The particle, pit or scratch is first removed the remaining damaged region is etched away without disturbing the intact underlying layers.

26 Claims, 5 Drawing Sheets

The classification of defects in EUVL masks

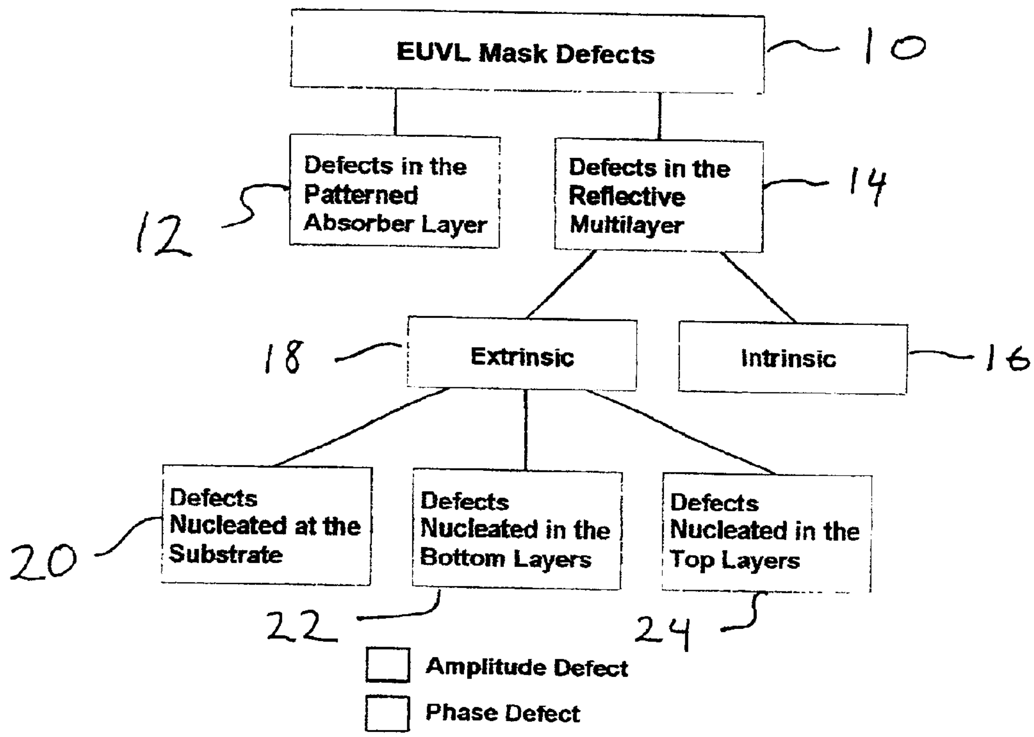
Figure 1. The classification of defects in EUVL masks

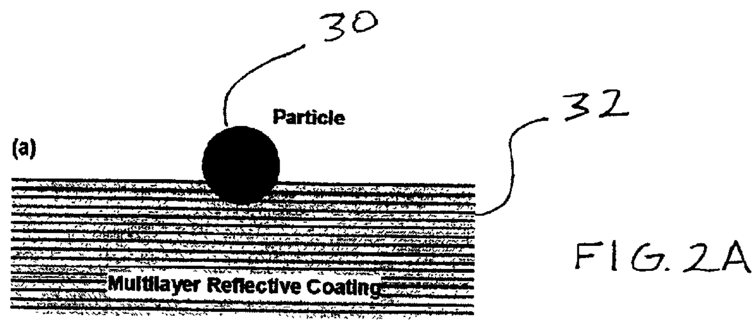
FIG. 2A
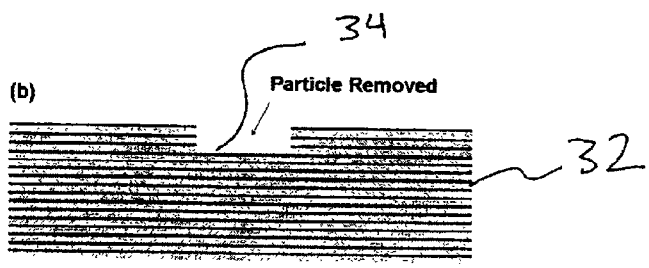
FIG. 2B
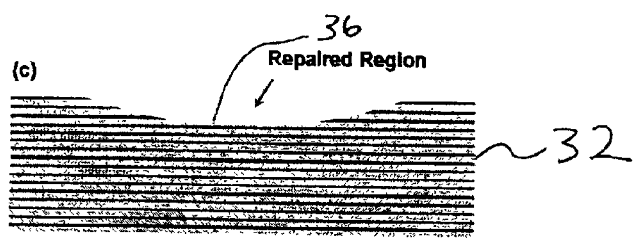
FIG. 2C
Figures 2A-2C

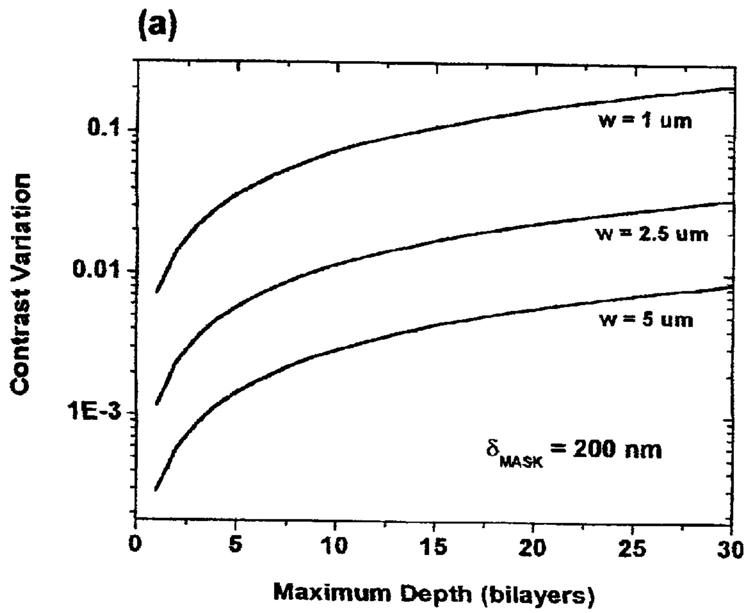
FIG. 6A
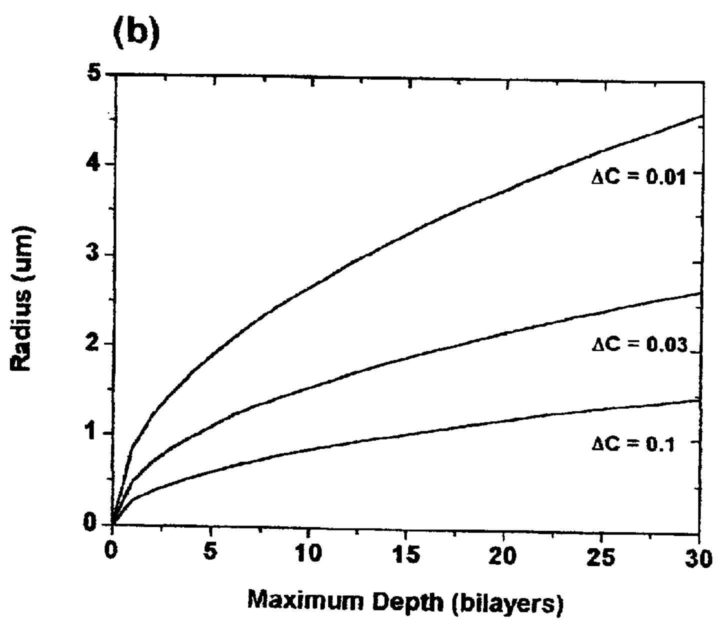
FIG. 6B
FIGURE 6

METHOD TO REPAIR LOCALIZED AMPLITUDE DEFECTS IN A EUV LITHOGRAPHY MASK BLANK

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to minimizing defects in the components produced by an extreme ultraviolet lithography (EUVL) system, and more specifically, it relates to a method for repairing amplitude defects in an EUVL mask blank.

2. Description of Related Art

Extreme ultraviolet lithography (EUVL) is a technology that employs projection optics to print integrated circuit patterns on silicon wafers at a wavelength of light of approximately 13 nm. Since absorption is high in all materials at this wavelength, the EUVL optics including the mask must be reflective. The EUVL reflective mask blank consists of a thick glass substrate that is first coated with a reflective multilayer film, and then coated with an absorber layer that is subsequently patterned. See C. W. Gwyn et al., J. Vac. Sci. Technol. B 16, 3142 (1998), S. Burkhart et al., Proc. SPIE, vol. 3676, p. 570, 1999 and T. Ikeda et al., "Reflection Type Mask", U.S. Pat. No. 5,052,033, granted Sep. 24, 1991.

Any defects in the reflective coating or absorber layer are problematic since they produce printing errors in the integrated circuit pattern on the wafer. The basic strategy is to develop extremely clean processes for fabricating the EUVL masks that minimize, and even eliminate, the defect population. However, trends in the current manufacturing of lithography masks suggest that there will be a cost benefit in developing a viable capability to repair a small number of defects on the EUVL mask. The classification (10) of defects that can occur in a EUVL mask is outlined in FIG. 1. Repair methods must be developed for all types of defects.

Referring to FIG. 1, defects (12) in the patterned absorber layer consist of regions where metal is unintentionally remaining or missing. These cause errors in the local amplitude of the reflected field, and hence are "amplitude defects". There currently exists a mature technology for repairing defects in the absorber layer of lithography masks that work in transmission. It is reasonable to expect that this technology, based on milling and deposition using a focused ion beam, can be extended to repair defects in the absorber layer of EUVL masks. See T. Liang et al., J. Vac. Sci. Technol. B 18, 3216 (2000).

Referring still to FIG. 1, a problem unique to EUVL masks is the existence of defects (14) in the reflective multilayer coating. The prototypical multilayer coating consists of 60 bilayers of molybdenum and amorphous silicon. The thicknesses of the individual layers are approximately 3 and 4 nm for the molybdenum and silicon, respectively. The reflectivity is a resonant property of the coating whereby the fields reflected by every pair of layers interfere constructively. Thus the reflectivity occurs through the depth of the film, and any deformation or disruption of the layer structure within the reflective coating can become a defect.

The classification of defects in the reflective multilayer coating naturally divides into two categories, as indicated in FIG. 1. The first category is the intrinsic-type defect (16). The intrinsic defect is nucleated by the statistical fluctuations that are characteristic of the vapor deposition process that is used to deposit the multilayer film. In particular, there is shot noise in the atom-by-atom deposition process that leads to the accumulation of random roughness. The variance of the roughness scales fairly linearly with the total thickness of the coating. The lower frequency components of the roughness are efficiently replicated by overlying layers and thereby propagate up towards the top of the coating. When one of these random thickness fluctuations exceeds a critical size that is approximately 0.5 nm in height and 100 nm in width, it becomes an intrinsic defect The resulting deformation of the layer structure produces an unacceptable perturbation in the phase of the reflected field. Hence intrinsic defects are "phase defects".

The second category of defect in the reflective multilayer coating is the extrinsic-type defect (18) as shown in FIG. 1. The extrinsic defect is a deformation or disruption of the multilayer structure nucleated by an external perturbation. This could be a particle, pit or scratch on the mask substrate, a particle imbedded in the multilayer film during the deposition process, or a particle, pit or scratch imbedded on the top of the coating after deposition. As indicated in FIG. 1, the effect of the defect on the reflected field will depend on where the defect is nucleated. When the nucleation occurs at the substrate (20), or in the bottom part of the multilayer coating (22), then the film growth dynamics will tend to damp out the structural perturbation, so that the top layers are deformed but not disrupted. In this case the defect produces a modulation of the phase of the reflected field, and is a "phase defect". The other possibility is that the defect is nucleated near or at the top of the multilayer coating (24). This could be a particle introduced during the deposition of the top layers, or a particle, pit or scratch imbedded in the top surface subsequent to the deposition. The particle and the damaged part of the multilayer coating will shadow the underlying layers and thereby attenuate the reflected field. Hence these are "amplitude defects".

U.S. Pat. No. 5,272,744, titled "Reflection Mask", granted Dec. 21, 1993 by Itou et al. describes a special reticle for x-ray and extreme ultraviolet lithography in order to facilitate the repair of multilayer defects. This reticle is comprised of two multilayer film stacks separated by an Au layer and is in contrast to the conventional reticle design incorporating patterned absorber layers on a multilayer film or the other design of a patterned multilayer on an absorber, as described in U.S. Pat. No. 5,052,033, titled "Reflection Type Mask" by T. Ikeda et al., granted Sep. 24, 1991. There are some disadvantages to the Itou et al. approach, including (i) their reticle is more difficult and expensive to fabricate than other designs, (ii) the introduction of the Au layer will likely introduce additional roughness in the reflective overlayer, reducing the reflectance and throughput of the lithography system, (iii) their repair process is not a local one, and involves covering the entire reticle blank with resist, etc, which could lead to new particulates/defects, and (iv) it is uncertain whether their method will work in a practical sense since it requires extreme control of the Au deposition and various etching processes so that a phase defect does not result from the multilayer defect repair process.

U.S. patent application Ser. No. 09/669,390, titled "Repair of Localized Defects in Multilayer-Coated Reticle Blanks for Extreme Ultraviolet Lithography", by the present inventors, filed Sep. 26, 2000 and incorporated herein by reference, discloses techniques for repairing multilayer phase defects in EUVL reticles. These techniques utilize a focused energetic beam to induce a contraction in a localized area of the multilayer. When the multilayer structure is significantly disturbed, the defective multilayer alters the amplitude as well as the phase of the reflected EUV light, and the defect is then designated as an "amplitude defect". The above technique would not be effective for repairing amplitude defects in EUVL reticles; the repair of amplitude defects in EUVL reticles is the subject of this invention.

It is important to develop methods for repairing all types of defects that are anticipated to occur in the multilayer reflective coating. The largest source of defects appears to be the extrinsic defects nucleated by substrate imperfections. A smoothing buffer layer can be deposited between the substrate and the reflective coating to mitigate most of these defects. See P. B. Mirkarimi and D. G. Stearns, Appl. Phys. Lett. 77, 2243 (2000) and U.S. patent application Ser. No. 09/454,715, titled "Mitigation of Substrate Defects in Reticles Using Multilayer Buffer Layers", by P. B. Mirkarimi et al. filed Dec. 6, 1999. Extrinsic defects nucleated near the bottom of the reflective multilayer coating, as well as all intrinsic defects, will be phase defects. Methods for repairing phase defects in multilayer coatings, based on locally heating the coating or modifying the absorber pattern, are currently under development. See. U.S. patent application Ser. No. 09/669,390, titled "Repair of Localized Defects in Multilayer-Coated Reticle Blanks for Extreme Ultraviolet Lithography", by the present inventors. The last category of defect that must be addressed is the extrinsic defect that is nucleated near or at the top of the reflective coating, and that modulates the amplitude of the reflected field. The invention that we describe below is a method for repairing this type of amplitude defect.

SUMMARY OF THE INVENTION

It is an object of the present invention to provide a method to repair an amplitude defect in a multilayer coating.

It is another object of the invention to provide a method for restoring the local reflectivity of a multilayer coating by physically removing a defect and leaving a wide, shallow crater that exposes the underlying intact layers.

These and other objects will be apparent to those skilled in the art based on the disclosure herein.

The EUV lithography mask blank consists of a thick substrate coated with a reflective multilayer film. A particle imbedded near the top of the coating, or a pit or scratch that damages the coating near the top surface, attenuates the EUV light and can significantly reduce the local reflectivity of the mask. When such a feature produces an unacceptable intensity modulation in the lithographic image, it is considered to be an amplitude defect. The present invention is a method to repair an amplitude defect in the multilayer coating. The invention exploits the fact that a significant number of layers underneath the amplitude defect are undamaged. The repair method restores the local reflectivity of the coating by physically removing the defect and leaving a wide, shallow crater that exposes the underlying intact layers.

The repair method consists of first removing the particle (if a particle exists) and secondly etching away the damaged region of the multilayer coating without disturbing the intact underlying layers. The particle is removed by milling using a high-resolution focused ion beam (FIB) operating near normal incidence and having a diameter less than 100 nm. The FIB has a gas source (consisting of, for example, He, Ne, Ar, Xe, F, Cl, I, Br), or a liquid metal source (consisting of, for example, Ga). The FIB is also used for imaging the defect during the repair process. The removal of the particle leaves a hole in the surface of the multilayer coating, with collateral damage in the vicinity of the hole due to implantation and redeposition. In the second step of the repair, the damaged part of the coating is removed by etching using a low-voltage (<5000 V) ion beam at a low angle of incidence (<20 degrees from the coating surface). This could be the same FIB that is used to remove the particle or a second ion beam. In this step the ion beam can be relatively large (up to 1 mm diameter) and can be rotated with respect to the mask to improve the uniformity of the etching process. The low-voltage, low-angle beam configuration is important because it does not significantly heat the coating during the repair process (the temperature is kept below 200° C.) and produces minimal damage at the surface. The result of the repair method is to replace the amplitude defect with a wide (10 $\mu$m–1 mm-diameter), shallow (typically <150 nm-depth) crater at the surface of the reflective multilayer coating that exposes the underlying intact layers and thereby restores the local reflectivity.

In addition to a FIB, it is possible that other tools may be used to remove the particle and produce a suitable crater in the multilayer coating. For example, there is a relatively new tool produced by Rave LLC and commercially available for the repair of absorber layers in patterned masks; this tool is similar to an Atomic Force Microscope but it has the capability to produce a crater of similar size and shape (in the multilayer coating) to that required by this invention. This tool could be used for both imaging the defective area and producing the crater.

This invention has the potential to impact the extreme ultraviolet lithography (EUVL) system currently under joint development between Lawrence Livermore National Laboratory(LLNL), Sandia National Laboratory, Lawrence Berkeley Laboratory and the EUV Limited Liability Company which consists of a consortium of companies in private industry. In addition to strong commercial applications, EUVL has the potential to impact government programs such as ASCII.

There is a strong commercial driving force for increased miniaturization in electronic devices, and hence an extreme ultraviolet lithography (EUVL) tool has significant commercial potential. To be economically viable this technology requires a nearly defect-free reflective reticle. Commercial integrated circuit manufacturers currently rely on defect repair techniques to obtain transmission reticles with sufficiently low defect densities; however, these repair techniques cannot be applied to the reflective EUVL reticles. The invention described here is a technique to repair defects in reflective EUVL reticles.

BRIEF DESCRIPTION OF THE DRAWINGS

FIG. 1 shows the classification of defects that can occur in a EUVL mask.

FIG. 2A shows a particle embedded a multilayer reflective coating.

FIG. 2B illustrates the removal of the imbedded particle.

FIG. 2C shows the result from the process of replacing the hole and the surrounding damaged part of the coating with a large-diameter, shallow crater.

FIG. 6A shows the variation of the contrast with the maximum depth of the crater for several different values of the radius.

FIG. 6B shows the radius of the crater required to achieve a fixed value of contrast, as a function of the maximum depth.

DETAILED DESCRIPTION OF THE INVENTION

Figure 3:
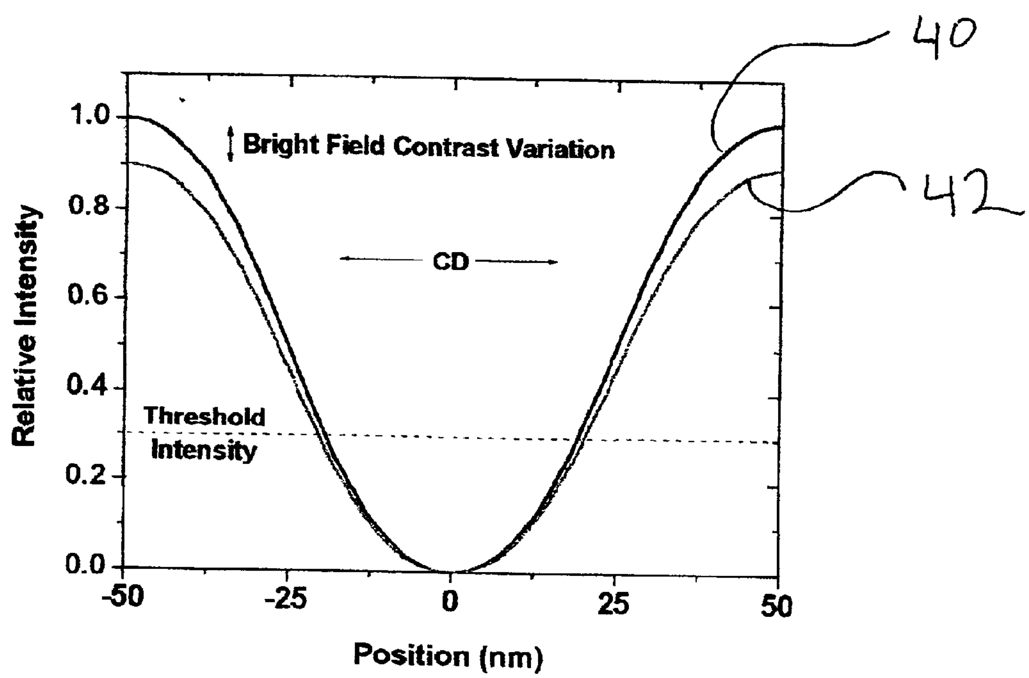
FIG. 3 compares the aerial image of a critical-dimension feature on an undamaged coating to the same feature located in the repaired region.

An amplitude defect in a reflective multilayer coating can be caused by the imbedding of a particle near or at the top of the coating. The particle reduces the local reflectivity of the coating in two ways:

The particle directly shadows the underlying layers, and thereby reduces the reflected field due to the absorption of light by the particle.

The particle damages the multilayer structure in its vicinity, either in the actual imbedding process, or during the growth of the multilayer around the particle. There is no contribution to the reflected field from the damaged region of the multilayer, and hence the local reflectivity is reduced due to absorption in the damaged region.

Even in the case where the particle does not remain imbedded in the coating, the residual damaged region of the multilayer acts as an amplitude defect In this case, the defect will physically appear as a pit or scratch in the top of the multilayer coating. It is also important to emphasize that the repair of amplitude defects in the multilayer coating is to be performed on the mask blank, prior to the deposition of the absorber layer.

The basic principle of the repair method is to restore the local reflectivity by removing the particle (if it exists) and the damaged part of the coating, while exposing the intact underlying layers of the multilayer coating. This process must satisfy two constraints. First, the intact underlying layers must not be damaged in the repair process. Second, the repaired region must not produce a significant variation of contrast in the bright field intensity of the lithographic image.

The repair method can be generally divided into two steps as shown schematically in FIGS. 2A–2C. FIG. 2A shows a particle 30 embedded a multilayer reflective coating 32. In the first step shown in FIG. 2B, the imbedded particle is physically removed by milling using a focused ion beam (FIB). See "Micro-machining using a focused ion beam" R. J. Young, Vacuum 44, 353 (1993), incorporated herein by reference. This step is not necessary if the defect is a pit or scratch. The FIB has a gas source (consisting of, for example, He, Ne, Ar, Xe, F, Cl, I, Br), or a liquid metal source (consisting of, for example, Ga). Using a FIB operated near normal incidence, material can be removed with a depth resolution of 10 nm and a lateral resolution of 100 nm. Typical operating parameters for a Ga ion source are a beam voltage of 25 keV, a beam current of 40 pA, a beam diameter of 50 nm, and a milling rate of 10 $\mu m^3$/nA-min. An advantage of this approach is that the FIB can simultaneously provide high-resolution images of the defect, which is useful for alignment and monitoring of the repair process. A potential problem of using the FIB is that Ga atoms are implanted into the coating to a depth of approximately 10 nm beneath the surface. This reduces the optical contrast of the Mo and Si layers directly underneath the amplitude defect, and requires that these layers be subsequently removed. A possible way to mitigate the implantation problem is to use a lower beam voltage at the cost of a larger beam diameter.

At this stage there is a small hole 34 in the multilayer coating, as shown in FIG. 2B, having a depth sufficient to remove the imbedded particle. The remaining structure is still defective because the FIB milling process produces collateral damage in the vicinity of the hole due to implantation and redeposition. Furthermore, the hole itself will produce a phase perturbation in the reflected field. To complete the repair of the defect it is necessary to remove the remaining damaged part of the multilayer coating in the vicinity of the hole, and to smooth out the contour of the surface of the coating. Specifically, the second step of the repair process replaces the hole and the surrounding damaged part of the coating with a large-diameter (10 $\mu$m–1 mm-diameter), shallow (typically <150 nm-depth) crater 36 as shown in FIG. 2C.

The crater is etched in the multilayer coating using a low-voltage (<5000 V) ion beam at a low angle of incidence (<20 degrees from the coating surface). This beam configuration is commonly used for the preparation of thin cross-sectional samples for transmission electron microscopy. See "Precision Ion Polishing System—A New Instrument For TEM Specimen Preparation Of Materials" R. Alani and P. R. Swann, Mat Res. Symp. Proc. 254, 43 (1992), incorporated herein by reference. It is well known that this technique can produce a shallow crater of controlled depth having a very smooth and gradual surface slope. The ion beam can be the same as that used for removing the particle (for example, a Ga-source FIB) or a second ion beam having a gas source (consisting of, for example, He, Ne, Ar, Xe, F, Cl, I, Br). The beam can be relatively large (up to 1 mm diameter) and can be rotated with respect to the mask to improve the uniformity of the etching process.

The conditions of low voltage and low angle of incidence for the ion beam are critical for avoiding damage to the underlying layers in the multilayer coating. One important requirement is that the temperature of the coating remains below approximately 200° C. throughout the repair process, since higher temperatures can activate structural relaxation at the Mo—Si interfaces. See "Stress, Reflectance, And Temporal Stability Of Sputter Deposited Mo/Si And Mo/Be Multilayer Films For Extreme Ultraviolet Lithography", P. B. Mirkarimi, Opt Eng. 38, 1246 (1999) It has been shown that etching Si using a Ar ion beam of 4 kV and 1 mA at an grazing angle of 20 degrees increases the temperature of the sample to ~85° C. See D. Bahnck and R. Hull, Mat. Res. Soc. Symp. Proc. 199, 253 (1990) (Title: "Experimental measurement of transmission electron microscope specimen temperature during ion milling"). The temperature increase is expected to be similar for a Mo—Si multilayer coating, and even smaller for lower beam voltage and lower incidence angles.

The other important advantage of using low voltage and low angle of incidence in the etching process is that it minimizes the damage to the layers exposed at the surface of the crater. There is always some mixing induced by the ion beam at the surface. However, studies of Ar ion etching of Si have shown that the thickness of this damaged surface region is in the range of 1–2 nm for a beam voltage of 2 kV and a grazing angle of 14 degrees. See T. Schuhrke et al., Ultramicroscopy 41, 429 (1992) (Title: "Investigation of surface amorphization of silicon wafers during ion-milling"). In the case of the Mo—Si multilayer coating, the mixing induced by the ion beam is likely to result in a thin surface layer of $MoSi_2$. This will actually provide a benefit of protecting the pure Mo and Si layers from oxidation. Alternatively, after the ion milling step a thin (1–2 nm) layer of Si can be deposited on top of the exposed multilayer coating in the repaired region, to limit the oxidation at the surface.

Efficacy of the Mask Blank Repair

In order to evaluate the efficacy of the repair, the effect of the residual crater on the lithographic image must be considered. The field reflected in the region of the crater will have a small modulation in phase and amplitude that will produce a small contrast in the bright field intensity at the wafer. The phase modulation is due to the slope of the surface inside the crater. The amplitude modulation arises from three effects. First, the reflectivity changes with the composition of the top layer and hence is modulated along rings within the surface of the crater, corresponding to the regions where the Mo and Si layers are alternately exposed. Second, the reflectivity in the crater is reduced due to the absorption of the surface layer, which is assumed to be $MoSi_2$, produced by ion beam mixing. Third, the reflectivity decreases with the number of bilayers that are remaining in the multilayer coating, which is a minimum in the bottom of the crater. Since the size of the crater (>10 $\mu$m radius) is much larger than the resolution element, $\delta$, at the mask ($\delta$~200 nm), the residual effect of the repair on the imaging performance will be to cause a local variation in the critical dimension (CD). This can be seen in FIG. 3, where the aerial image of a critical-dimension feature on an undamaged coating (line 40) is compared to the same feature located in the repaired region (line 42). Using a simple threshold model for the resist, the CD is determined by the width of the aerial image at the threshold intensity. It is evident that the change in the bright field contrast associated with the repaired region produces an increase in the CD. An estimate of the increase in CD produced by a bright field contrast variation $\Delta C$ is, $$\Delta CD(\%)=0.5\Delta C(\%) \tag{1}$$

The total budget for the allowable CD variation in EUVL is expected to be 5%. This must be divided among many sources such as flare, pattern error, optical distortion and resist non-uniformity. Hence the CD error budget available to mask defects is more likely to be in the range of ~2%. Using Eq. (1), this implies that the contrast variation in the bright field intensity produced by the repaired region of the multilayer coating should be less than ~4%.

Figure 4:
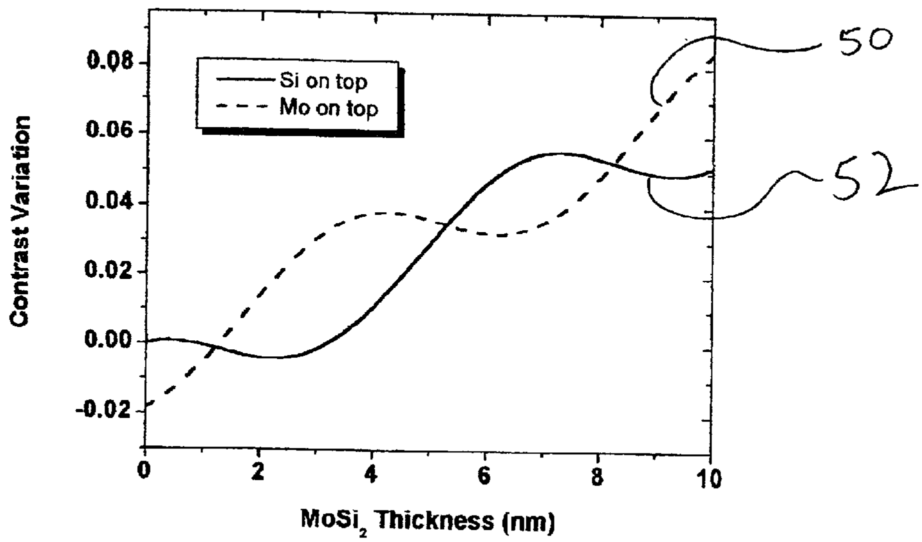
FIG. 4 plots the contrast variation due to the changing of the composition of the top layer between Mo and Si as a function of the thickness of the $MoSi_2$ surface layer.

The different contributions to the bright field contrast variation must be considered. The contrast variation due to the changing of the composition of the top layer between Mo and Si is plotted in FIG. 4 as a function of the thickness of the $MoSi_2$ surface layer. The undamaged multilayer coating has a top layer of Si (actually $SiO_2$ after oxidation when exposed to atmosphere). The top layer in the repaired region will alternate between Mo and Si with increasing depth of the crater (see FIG. 2C). FIG. 4 shows that the contrast variation is different for the Mo (50) and Si (52) top layers, but generally increases with increasing $MoSi_2$ thickness. A similar behavior will occur if there is an oxidized protective layer of Si deposited on the surface of the repaired region.

Figure 5:
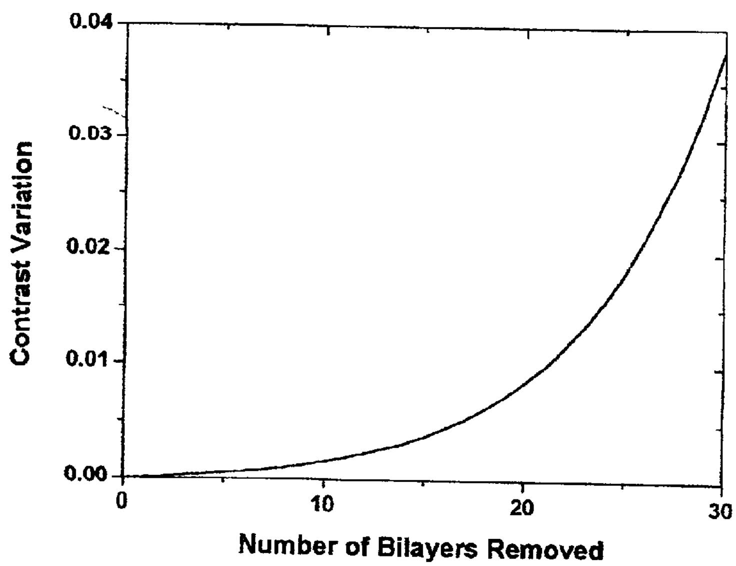
FIG. 5 shows the contrast variation as a function of the number of layer pairs that are removed, assuming that the undamaged coating has 60 layer pairs.

Another source of contrast variation within the repaired region is the decreased number of layer pairs in the multilayer coating. FIG. 5 shows the contrast variation as a function of the number of layer pairs that are removed, assuming that the undamaged coating has 60 layer pairs. It can be seen that this is a fairly small effect; the removal of 20 bilayers results in a contrast variation of less than 1%.

Finally, the shallow crater in the surface of the repaired coating perturbs the phase of the reflected field, resulting in an additional variation of the contrast in the lithographic image. Let us assume that the depth profile of the crater produced by the repair process is Gaussian with a maximum depth of N bilayers and a radius w. Then the resulting phase perturbation, $\phi(r)$, in the reflected field is given by, $$\phi(r) = 4\pi N\frac{(n-1)}{n}\exp(-r^2/w^2) \tag{1}$$

where $\lambda$ is the vacuum wavelength of the EUV light and n is the average index of refraction of the multilayer coating (n=0.97 for Mo/Si). The image intensity at a defocus value of $\Delta z$ is related to the second derivative of the phase according to [J. M. Cowley, "Diffraction Physics, $2^{nd}$ ed." (North-Holland, Amsterdam, 1984) p. 61], $$I(r) = 1 + \Delta z\frac{\lambda}{2\pi}\nabla^2\phi(r) = 1 + \frac{\lambda^2}{2\pi(NA)^2}\nabla^2\phi(r) = 1 + \frac{\delta^2}{2\pi}\nabla^2\phi(r) \tag{2}$$

Here we have used for the defocus position a value of $\Delta z=\lambda/(NA)^2$ which is twice the conventional depth of focus (this is a very conservative case), and we have defined the resolution element at the mask to be $\delta=\lambda/(NA)$. Substituting into Eq. (2) from Eq. (1) we obtain, $$I(r) = 1 - 4N\delta^2\frac{(n-1)}{n}\frac{w^2-2r^2}{w^4}\exp(-r^2/w^2) \tag{3}$$

The contrast variation in the image intensity is determined from Eq. (3) to be, $$\Delta C \equiv \frac{I_{MAX}-I_{MIN}}{I_{MAX}+I_{MIN}} = 5.78N\frac{(n-1)}{n}\frac{\delta^2}{w^2} \tag{4}$$

Now we can estimate the image contrast due to the phase error produced by the profile of the repaired region for realistic lithographic parameters. Consider an operating wavelength of 13 nm and a numerical aperture on the image side of 0.25, which corresponds to a resolution element on the mask of approximately 200 nm. The variation of the contrast with the maximum depth of the crater is shown in FIG. 6A for several different values of the radius w. It is evident that the contrast increases rapidly with increasing depth. However, when the radius is 5 $\mu$m the contrast remains less than 1% for a depth as large as 30 bilayers. FIG. 6B shows the radius of the crater required to achieve a fixed value of contrast, as a function of the maximum depth. It is evident that a crater having a radius greater than 5 $\mu$m, or a diameter greater than 10 $\mu$m, will produce a contrast variation in the image intensity of less than 1%.

Since the total allowable bright field contrast variation produced by the repaired defect is 4%, then the contributions from each of the sources described above must be limited to around 1%. This sets fairly narrow specifications for the structure of the repaired multilayer. The consideration of the modulation of the reflectivity due to the top layer (FIG. 4) requires that the thickness of the $MoSi_2$ surface layer be ~2 nm or less. A protective Si layer deposited on the surface to limit oxidation can be approximately twice as thick, or up to 4 nm. The dependence of the contrast on the number of bilayers removed in the repair process restricts the crater to having a maximum depth of ~20 bilayers (FIG. 5). A crater that is 20 bilayers deep must have a diameter greater than 10 $\mu$m to keep the phase contrast below the 1% value (FIG. 6B). It is thus concluded that the repair method of removing an amplitude defect and replacing it with a shallow crater is viable in terms of its effect on the lithographic image. However, the resulting shallow crater is required to have a maximum depth of 20 bilayers and a minimum diameter of approximately 10 $\mu$m. This will maintain the local variation in the CD to be less than 2%, well within the EUVL error budget We note that there is no upper limit to the allowable diameter of the crater, and that in practice it could be more convenient to have the diameter of the crater be considerably larger than 10 $\mu$m, even as large as 1 mm. This would allow the use of a larger-diameter ion beam for the etching of the crater, i.e. the ion beam diameter could be as large as the crater diameter of 1 mm.

The foregoing description of the invention has been presented for purposes of illustration and description and is not intended to be exhaustive or to limit the invention to the precise form disclosed. Many modifications and variations are possible in light of the above teaching. The embodiments were chosen and described to best explain the principles of the invention and its practical application to thereby enable others skilled in the art to best use the invention in various embodiments and with various modifications suited to the particular use contemplated. The scope of the invention is to be defined by the following claims.

We claim:

1. A method for repairing an amplitude defect in a multilayer coating, comprising:

removing a defect that is causing said amplitude defect from said multilayer coating, wherein said defect is selected from the group consisting of a particle, a shallow pit and a scratch, wherein a damaged region of said multilayer coating will remain after removal of said defect; and etching away said damaged region.

2. The method of claim 1, wherein the step of etching away said damaged region is carried out without disturbing the intact underlying layers of said multilayer coating.

3. The method of claim 1, wherein the step of removing a particle includes milling said particle out of said multilayer coating.

4. The method of claim 3, wherein the step of milling is carried out with a focused ion beam (FIB).

5. The method of claim 4, wherein said FIB is operated near normal incidence.

6. The method of claim 4, wherein said FIB has a diameter less than 100 nm.

7. The method of claim 4, wherein said FIB comprises a gas source.

8. The method of claim 7, wherein said gas source comprises a gas selected from the group consisting of He, Ne, Ar, Xe, F, Cl, I and Br.

9. The method of claim 4, wherein said FIB comprises a liquid metal source.

10. The method of claim 9, wherein said liquid metal source comprises a liquid metal selected from the group consisting of Ga, Si, In, Pb and Hg.

11. The method of claim 4, further comprising imaging said defect with said FIB.

12. The method of claim 1, further comprising imaging said defect during the step of removing and the step of etching.

13. The method of claim 12, wherein the step of imaging is carried out using a focused ion beam.

14. The method of claim 1, wherein the step of etching away said damaged region is carried out using an ion beam having a voltage of less than 5000 V.

15. The method of claim 14, wherein said ion beam has a diameter within the range from about 10 nm to about 1 mm.

16. The method of claim 14, wherein said ion beam is rotated with respect to said multilayer coating to improve the uniformity of the etching process.

17. The method of claim 1, wherein the step of etching away said damaged region is carried out at a temperature less than 200° C.

18. The method of claim 1, wherein the step of etching away said damaged region produces a crater in the surface of said multilayer coating that has a diameter of greater than 10 $\mu$m and a depth of less than 150 nm.

19. The method of claim 1, wherein the step of etching away said damaged region is carried out using an ion beam at an angle of incidence that is less than 20 degrees from the surface of said multilayer coating.

20. The method of claim 19, wherein said ion beam is rotated with respect to said multilayer coating to improve the uniformity of the etching process.

21. The method of claim 4, further comprising removing atoms implanted by milling step to remove defect.

22. The method of claim 1, wherein said particle is on the top of, or imbedded near the surface of, said multilayer coating, surrounded by a localized region of damaged multilayer coating.

23. The method of claim 1, further comprising minimizing the slope of the surface of said multilayer coating in the repaired region.

24. The method of claim 1, further comprising depositing a Si layer subsequent to the step of removing a defect, wherein said Si layer is about 1 to 4 nm thick, wherein said Si layer limits oxidation of the exposed multilayer coating.

25. A method for repairing an amplitude defect in a multilayer coating, comprising physically removing the defect from said multilayer coating and leaving a wide, shallow crater that exposes the underlying intact layers to restore the local reflectivity of the coating.

26. The method of claim 1, wherein the step of removing a defect is carried out with an Atomic Force Microscope (AFM) having the capability to produce a crater.

* * * * *